US012585042B2

(12) United States Patent
Segovia Fernandez et al.

(10) Patent No.: US 12,585,042 B2
(45) Date of Patent: Mar. 24, 2026

(54) OPTICAL DETECTOR INCLUDING PLASMONIC METASURFACES AND BULK ACOUSTIC WAVE RESONATORS

(71) Applicant: TEXAS INSTRUMENTS INCORPORATED, Dallas, TX (US)

(72) Inventors: Jeronimo Segovia Fernandez, San Jose, CA (US); Ting-Ta Yen, San Jose, CA (US); Hassan Omar Ali, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 287 days.

(21) Appl. No.: 17/515,047

(22) Filed: Oct. 29, 2021

(65) Prior Publication Data

US 2022/0357483 A1 Nov. 10, 2022

Related U.S. Application Data

(60) Provisional application No. 63/184,041, filed on May 4, 2021.

(51) Int. Cl.
| | |
|---|---|
| *G02B 1/00* | (2006.01) |
| *G01J 1/04* | (2006.01) |
| *G02B 5/00* | (2006.01) |
| *H03H 9/17* | (2006.01) |

(52) U.S. Cl.
CPC ............ *G02B 1/002* (2013.01); *G01J 1/0418* (2013.01); *G02B 5/003* (2013.01); *H03H 9/17* (2013.01)

(58) Field of Classification Search
CPC .......... H03H 9/17; G02B 1/002; G02B 5/003; G01J 1/0418
See application file for complete search history.

(56) References Cited

U.S. PATENT DOCUMENTS

| | | | | |
|---|---|---|---|---|
| 2012/0293278 | A1* | 11/2012 | Burak | H03H 9/173 |
| | | | | 333/189 |
| 2021/0203303 | A1* | 7/2021 | Schiek | H03H 9/542 |
| 2022/0103159 | A1* | 3/2022 | Shin | H03H 3/04 |
| 2023/0061753 | A1* | 3/2023 | Bahr | G01J 1/0403 |
| 2023/0137953 | A1* | 5/2023 | Segovia-Fernandez | |
| | | | | H10N 30/304 |
| | | | | 310/311 |

* cited by examiner

*Primary Examiner* — Samuel S Outten
(74) *Attorney, Agent, or Firm* — Zhenhai Fu; Frank D. Cimino

(57) ABSTRACT

An apparatus for an optical detector includes a bulk acoustic wave (BAW) resonator including a piezoelectric layer and a metal layer, an acoustic Bragg mirror on the BAW resonator and including a first acoustic impedance layer and a second acoustic impedance layer different than the first acoustic impedance layer, and a plasmonic metasurface on the acoustic Bragg mirror and including structures of geometric patterns arranged in an array.

32 Claims, 11 Drawing Sheets

500

600

1100

1200

OPTICAL DETECTOR INCLUDING PLASMONIC METASURFACES AND BULK ACOUSTIC WAVE RESONATORS

CROSS-REFERENCE TO RELATED APPLICATIONS

The present application claims priority to U.S. Provisional Patent Application No. 63/184,041, which was filed May 4, 2021, is titled "Infrared Detector Based on Plasmonic Metasurfaces Integrated on Bulk Acoustic Wave Resonators," and is hereby incorporated herein by reference in its entirety.

BACKGROUND

A metasurface is an artificially made material, also referred to as a metamaterial, that includes structures of symmetrically arranged geometric patterns having sub-wavelength dimensions with respect to a targeted portion of the electromagnetic spectrum. A plasmonic metasurface is a type of metasurface that exhibits a negative real permittivity and, under specific conditions of electromagnetic excitation, can create surface charge-density oscillations known as surface plasmon-polaritons (SPPs). Plasmonic metasurfaces are formed by metals or metal-like materials, such as a combination of metallic and dielectric materials, and contain subwavelength-scaled structures that are distributed on or under the surface. The structures may have similar or different geometries and may be repeated and spaced across a layer to alter the behavior of electromagnetic waves, thereby generating the SPPs. For example, the structures may be separated circular, square or cross-like metal patches that are placed on a dielectric layer. A plasmonic metasurface can be designed to interact with an electromagnetic wave in a certain light spectrum, such as visible or infrared (IR) light, to absorb or reflect light at a certain wavelength or frequency.

SUMMARY

In accordance with at least one example of the description, an apparatus includes a bulk acoustic wave (BAW) resonator including a piezoelectric layer and a metal layer, an acoustic Bragg mirror on the BAW resonator and including a first acoustic impedance layer and a second acoustic impedance layer different than the first acoustic impedance layer, and a plasmonic metasurface on the acoustic Bragg mirror and including structures of geometric patterns arranged in an array.

In accordance with another example of the description, an optical device includes a plasmonic metasurface configured to absorb a portion of an incident light on the optical device, wherein the portion of the incident light has a frequency range that is narrower than a frequency spectrum of the incident light, and absorbing the portion of the incident light generates thermal energy at the plasmonic metasurface; a BAW resonator configured to receive the thermal energy from the plasmonic metasurface, convert an applied electrical signal into an acoustic wave, and shift an acoustic resonance frequency of the acoustic wave according to the thermal energy; and an acoustic Bragg mirror between the plasmonic metasurface and the BAW resonator, the acoustic Bragg mirror configured to reflect a portion of the acoustic wave away from the plasmonic metasurface and toward the BAW resonator.

In accordance with another example of the description, a light detector system includes a light source configured to emit a light beam having a frequency spectrum, and a light detector configured to detect an intensity of the light beam in the frequency spectrum, the light detector including a plasmonic metasurface including structures of geometric patterns arranged in a two-dimensional array, an acoustic Bragg mirror coupled to the plasmonic metasurface and including a first acoustic impedance layer and a second acoustic impedance layer, a BAW resonator coupled to the acoustic Bragg mirror and including a piezoelectric layer and a metal layer, a substrate coupled at a first end to the piezoelectric layer and at a second end to the metal layer of the BAW resonator, first and second contacts on opposite sides of the BAW resonator, and a gap between the BAW resonator and the substrate.

BRIEF DESCRIPTION OF THE DRAWINGS

For a detailed description of various examples, reference will now be made to the accompanying drawings in which.

DETAILED DESCRIPTION

Figure 1:
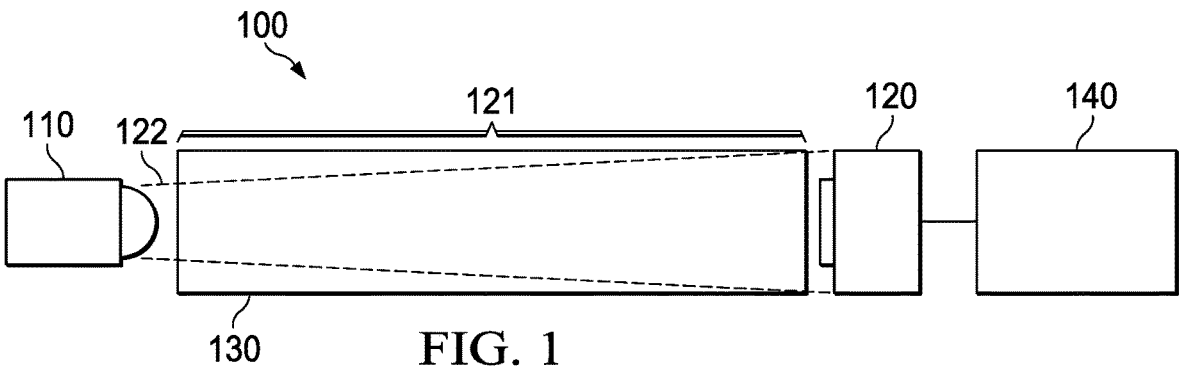
FIG. 1 is a block diagram of a light detector system, in accordance with various examples.

Optical or light detectors, which may also be referred to as optical sensors, are types of devices that detect light at a specific frequency or wavelength range. The detection includes absorbing a portion of light radiation that illuminates a surface of the detector and converting it into a signal, such as an electrical signal, which can be measured and analyzed. Light that illuminates or is projected onto a surface may also be referred to as incident light. Analysis of the measured electrical signal is useful to infer the characteristics of a sample exposed to the light radiation. The characteristics of the sample may include the type, composition, or density of substances in the sample. For example, optical detectors can serve as gas or fluid detectors that operate according to one or various light sources and frequency spectrum, such as infrared, visible light, or ultraviolet laser sources. Optical detectors may include various materials and layers designed for specific detection applications.

An optical detector may include a plasmonic metasurface that is engineered according to the application. This may involve the plasmonic metasurface achieving a peak in absorption at a wavelength of light and substantially low or no absorption away from that wavelength. Such response is referred to as a plasmonic resonance response and the wavelength at the peak absorption is referred to as the plasmonic resonance wavelength. The plasmonic resonance response may provide a filtering effect of the incident light where light may be absorbed within a relatively narrow wavelength range with respect to the frequency spectrum of the emitted light. Plasmonic metasurface design includes determining the size and spacing of structures dispersed across the plasmonic metasurface, for instance in the form of a two-dimensional (2D) array. To achieve detection, the plasmonic metasurface may be combined with other materials and layers that are stacked over one another and anchored with low thermal coupling to a base, such as a silicon (Si) or other form of substrate. Responsive to projecting incident light on the plasmonic metasurface, the incident light energy may interact with the plasmonic metasurface causing charge oscillation at the surface, which may be referred to as a plasmon. The charge oscillation generated at the plasmonic metasurface can propagate as thermal energy into sublayers in the detector and is useful for detection.

The optical detector can also include a bulk acoustic wave (BAW) resonator that can provide an acoustic wave and responds to the thermal energy generated in the plasmonic metasurface by shifting its acoustic resonance frequency. The BAW resonator includes a piezoelectric layer positioned between two metal layers which act as electrodes for applying an electrical signal, such as in the form of voltage, to the piezoelectric layer. The piezoelectric layer converts the applied electrical signal into an acoustic wave.

The BAW resonator is designed to achieve an acoustic resonance response that may not be directly affected by the plasmonic metasurface. The acoustic resonance response refers to a peak in the amplitude of the acoustic wave in the piezoelectrical layer responsive to applying an electrical signal to the metal layers of the BAW resonator. However, combining the plasmonic metasurface with a BAW resonator to achieve an acoustic resonance response suitable for accurate optical detection can be challenging. The acoustic wave provided by the BAW resonator may interact with the 2D array of structures that form the plasmonic metasurface and generate dispersion and spurious modes in the acoustic wave. The spurious modes are excited frequencies other than the acoustic resonance frequency in the acoustic wave, which can cause the degrading of the acoustic resonance response and may not be suitable for implementing light detection.

This description provides various examples of combining a plasmonic metasurface with a BAW resonator in an optical detector to achieve a particular acoustic resonance response.

The optical detector may include an acoustic Bragg mirror disposed between the plasmonic metasurface and the BAW resonator. The acoustic Bragg mirror may be composed of at least two different acoustic impedance layers in order to achieve sufficiently high acoustic impedance mismatch, to function as a reflector to the acoustic wave, and the thickness of each layer may be equivalent to one quarter wavelength of the acoustic mode excited by the BAW resonator at its resonance frequency. The acoustic impedance layers may be of different materials having different acoustic impedance properties. For example, the two different acoustic impedance layers may include a first acoustic impedance layer having a higher acoustic impedance than the second acoustic impedance layer. As such, the layers may be designed to effectively function as a mirror or reflector keeping the acoustic wave substantially confined in the BAW resonator. The confinement of the acoustic wave is caused by reflecting the acoustic wave in the BAW resonator away from the plasmonic metasurface. Thus, the acoustic wave is prevented or substantially suppressed from interacting with the plasmonic metasurface 2D array structures to avoid degrading the acoustic resonance response. The amount of acoustic wave energy reflected away from the plasmonic metasurface may be increased by increasing the difference between the acoustic impedance layers of the acoustic Bragg mirror. The optical detector may also include two or more contacts that couple the BAW resonator to a substrate. The contacts may be designed to decrease thermal contact between the two components and therefore increase thermal isolation. Increasing the thermal isolation of the optical detector layers may increase the electric signal response and therefore the detection sensitivity of the optical detector. A length to width ratio of the contacts may be chosen to increase the thermal isolation while providing sufficient support for the device on the substrate.

FIG. 1 is a block diagram of a light detector system 100, in accordance with various examples. The light detector system 100 may include a light source 110 and a light detector 120 separated by a space 121. The light source 110 may be any light emitting device that emits a light beam 122 directed toward the light detector 120. For example, the light source 110 may be a laser that emits light in the visible spectrum or the infrared spectrum. The light detector 120 may be positioned in front of the light source 110 to detect at least a portion of the emitted light that is incident on the surface of the light detector 120. The light detector 120 may be designed to absorb the light within a wavelength or frequency range, which falls in the light spectrum of the light source 110. The intensity or amplitude of the absorbed portion of the light beam 134 may be detected by the optical detector 120. The components of the optical detector 120 may be encased in a package to protect the optical detector 120.

A sample of a chemical substance to be analyzed may be disposed in the space 121 between the light source 110 and the light detector 120 such that the sample is exposed to the light beam 122. The light incident on the surface of the light detector 120 may be collected at the light detector 120 and converted into an electrical signal which may be analyzed to infer characteristics of the sample. For example, the sample may be a fluid, a gas, or multiple gases in the space 121. The characteristics of the sample may include the chemical composition, density, concentration, or molecular size of the sample. The space 121 may include a chamber 130 for holding or containing the sample. The chamber 130 may include openings in front of the light source 110 and the light detector 120 to allow the passing of the light from the light source 110 to the light detector 120 through the chamber 130. The chamber 130 may also include one or more openings for injecting the sample into the chamber 130 and/or passage of the sample out of the chamber 130. The light detector system 100 may also include a processing system 140 electrically coupled to the light detector 120. The processing system 140 may receive the electrical signal from the light detector 120, responsive to the light detector 120 detecting the amplitude of light from the light source 110. The electrical signal may be analyzed to determine the characteristics of the sample. The processing system 140 may include a processor for processing the electrical signal based on stored data and/or models for characterizing the sample. For example, the processing system 140 may be a computer system including a processing chip and a storage medium.

Figure 2A:
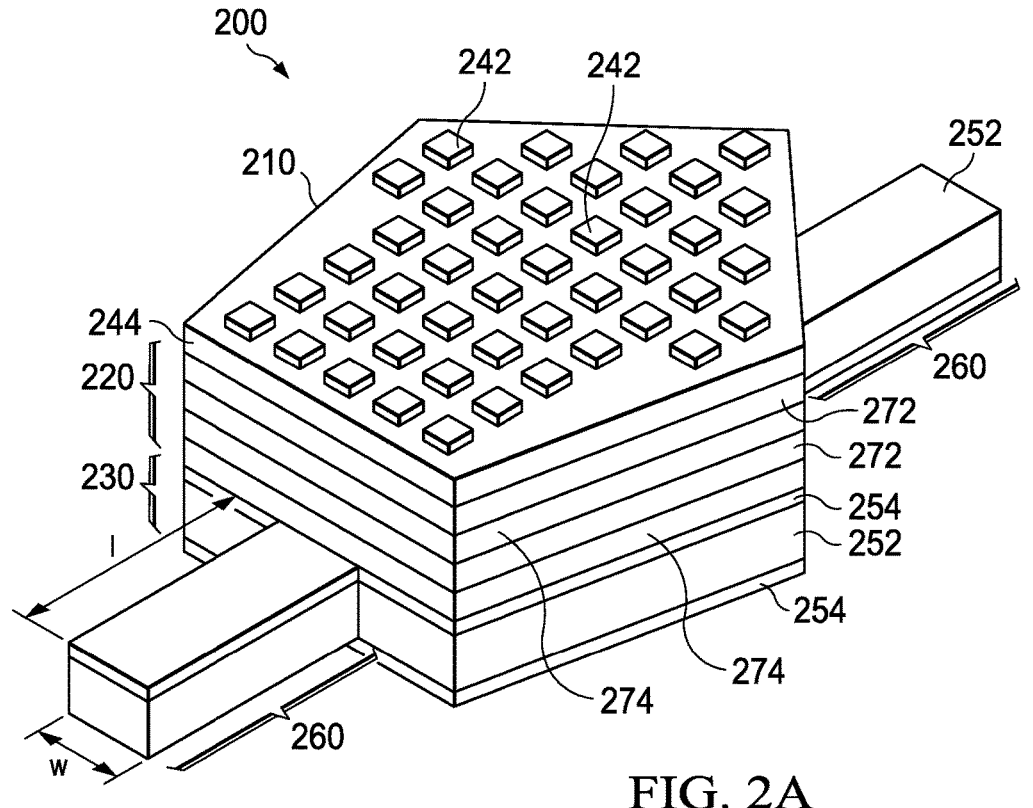
FIG. 2A is a diagram of an optical device, in accordance with various examples.
Figure 2B:
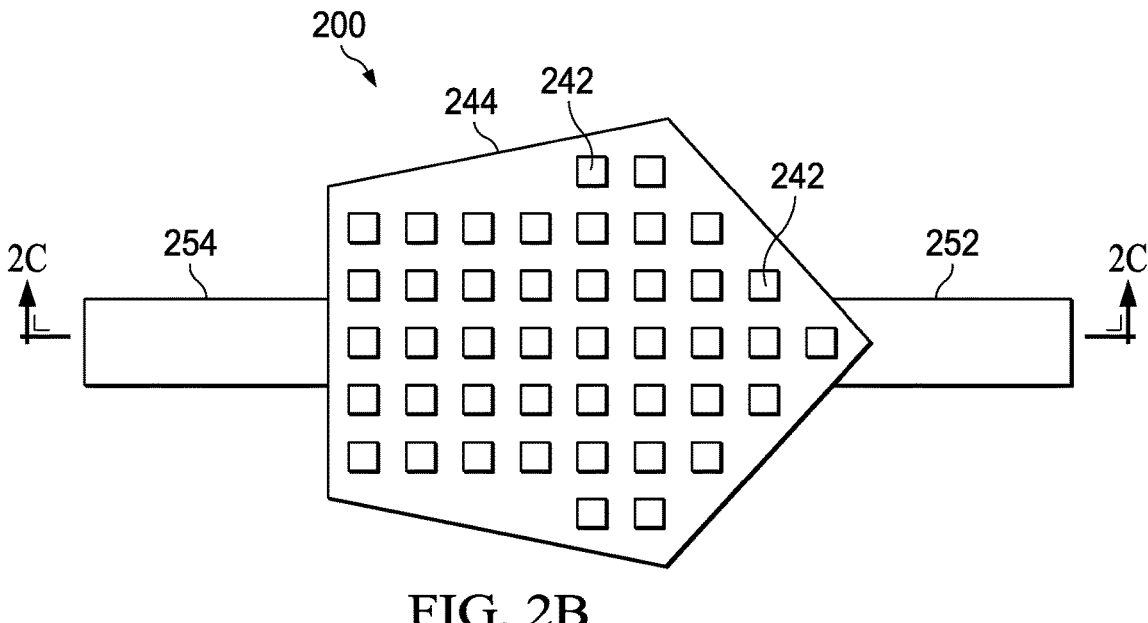
FIG. 2B is a diagram of a top view of the optical device of FIG. 2A, in accordance with various examples.
Figure 2C:
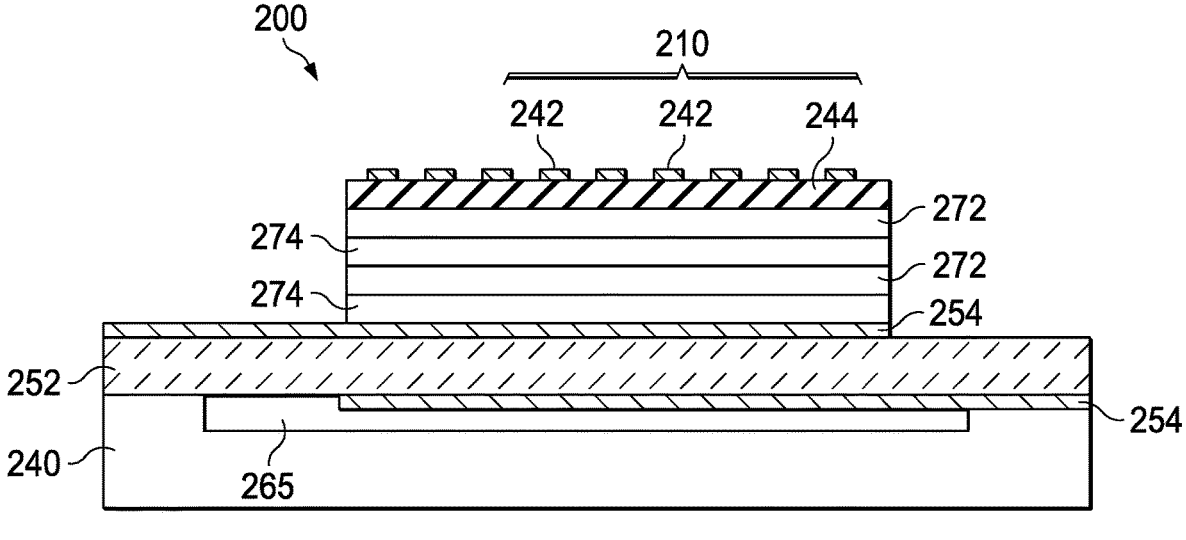
FIG. 2C is a diagram of a cross sectional view of the optical device of FIG. 2A, in accordance with various examples.

FIGS. 2A to 2C show various side views of an optical device 200, in accordance with various examples. The optical device 200 may be a light sensing device capable of absorbing incident light on a surface of the optical device 200, which is useful for detecting the intensity or amplitude of the absorbed light. For example, the optical device 200 may be part of the light detector 120. The optical device 200 may include multiple layers and materials designed to increase the absorbed amount or portion of the incident light within a certain wavelength range. Increasing the amount of absorbed light may increase the signal-to-noise ratio in a light detection system and provide for more accurate detection results. In some examples, the optical device 200 includes a plasmonic metasurface 210 and an acoustic Bragg mirror 220 disposed on a BAW resonator 230, which is disposed on a substrate 240. The thermal energy in the plasmonic metasurface 210 responsive to the absorption of the incident light may cause a shift of the acoustic resonance frequency of the BAW resonator 230. The frequency shift can be detected electrically. For example, the BAW resonator 230 may be coupled to an oscillator circuit (not shown) as a frequency selective component in a feedback loop with the oscillator circuit. Accordingly, the frequency shift can be detected by measuring the output frequency of the oscillator circuit with a frequency counter.

The plasmonic metasurface 210 may include a one-dimensional (1D) or two-dimensional (2D) array of structures 242 disposed on or in a dielectric layer 244. For example, the structures 242 may correspond to a grid or array of metal patches equally spaced on the dielectric layer 244. In another example, the plasmonic metasurface 210 may include a grid or array of equally spaced gaps in a metal sheet or layer. The gaps may be empty space or may be filled with a dielectric or other material. The structures 242 may have patterns of various geometries, sizes, and spacing. For example, the structures 242 may have geometries such as square, round, slit, or cross patterns. The spacing of the structures 242 may determine the plasmonic resonance response of the plasmonic metasurface 210 in the form of acoustic waves distributed across a wavelength range. The size of the structures 242 may change the plasmonic resonance response of the plasmonic metasurface 210 within the wavelength range.

The BAW resonator 230 may include a piezoelectric layer 252 disposed between two metal layers 254, which may be similar in some examples. The piezoelectric layer 252 may be formed from a piezoelectric material. An example of a piezoelectric material is a crystal material capable of converting mechanical energy into electrical energy and converting electrical energy into mechanical energy. For example, the piezoelectric layer 252 may be an Aluminum Nitrate (AlN) layer and the metal layers 254 may be Molybdenum (Mo) layers. The acoustic resonance frequency of the BAW resonator 230, which may be set according to the thicknesses and acoustic impedance of the BAW resonator layers, may shift by the thermal energy generated in the plasmonic metasurface 210 responsive to the absorbed light.

The piezoelectric layer 252 and the metal layers 254 may extend on at least one side of the BAW resonator 230 to form a contact 260. As shown in FIGS. 2A to 2C, some implementations of the optical device 200 may include two contacts 260 on opposite sides of the BAW resonator 230. The two contacts 260 may provide stability support to the BAW resonator 230 on the substrate 240 to reduce bending in the BAW resonator 230, such as resulting from the stress gradient that is induced across the forming material layers. In other examples, the plasmonic metasurface 210 may include more than two contacts 260 on different sides of the BAW resonator 230 in a symmetric arrangement that provides stability support. The optical device 200 may also include a gap 265 between the BAW resonator 230 and the substrate 240. The gap 265 may isolate the vibrations from the substrate 240 and limit thermal coupling between the BAW resonator 230 and the substrate 240. As shown in FIG. 2C, a metal layer 254 may not extend across the entire surface between the piezoelectric layer 252 and the gap 265. This may allow a portion of the piezoelectric layer 252 to be directly coupled to the gap 265 to reduce thermal coupling and increase thermal isolation of the BAW resonator 230. The thermal coupling may also be increased by designing the length (l) to width (w) ratio of the contact 260 to achieve a high length to width ratio (e.g., to cause a thinner) contact 260 while also limiting bending in the structure to achieve stable support for the BAW resonator 230. Examples of the length (l) and width (w) values for the contacts 260 are provided below.

The acoustic Bragg mirror 220 may include at least one pair of first and second acoustic impedance layers 272 and 274. The acoustic impedance layers 272 and 274 may be two layers of two different respective materials with different acoustic impedance properties. For example, the acoustic Bragg mirror 220 may include two stacked pairs of acoustic impedance layers 272 and 274, as shown in FIGS. 2A and 2C. In other examples, the acoustic Bragg mirror 220 may include fewer or more than two stacked pairs of acoustic impedance layers 272 and 274. The acoustic impedance properties of the acoustic impedance layers 272 and 274 determine an amount of acoustic wave energy reflected by the acoustic Bragg mirror 220. For example, the acoustic impedance layers 272 and 274 may be layers of material having different acoustic impedance properties. Stacking two layers of material having different impedance properties on one another can function as a mirror or reflector for acoustic waves. The amount of acoustic wave energy reflected away from the stacked layers may be increased by increasing a difference between the acoustic impedance properties of the layers. For example, the pair of acoustic impedance layers 272 and 274 may be titanium tungsten (TiW) and Silicon Oxide ($SiO_2$) layers, respectively. As described above, the acoustic impedance layers 272 and 274 may be designed to reflect the acoustic wave energy generated by the BAW resonator 230 away from the plasmonic metasurface 210. This may confine the acoustic wave in the BAW resonator 230 and reduce degradation of the acoustic resonance response of the BAW resonator 230.

To provide an example of the impact of the acoustic Bragg mirror 220 on the acoustic resonance response of the optical device 200, various designs of optical devices similar to the optical device 200 are described herein. The designs provide for optical devices including plasmonic metasurface and BAW resonator structures similar to the plasmonic metasurface 210 and the BAW resonator 230, respectively. The impact of the acoustic Bragg mirror 220 is shown by comparing the acoustic resonance responses of the designs with and without the presence of the acoustic Bragg mirror 220 between similar plasmonic metasurface and BAW resonator structures. The acoustic resonance response can be characterized by admittance data for the optical devices in the various designs. The admittance data may be a measure of the acoustic energy transformed into electrical energy by the piezoelectric layer 252. The changes in the admittance data may be attributed to the absence or presence of the acoustic Bragg mirror 220 in the respective designs.

Figure 3:
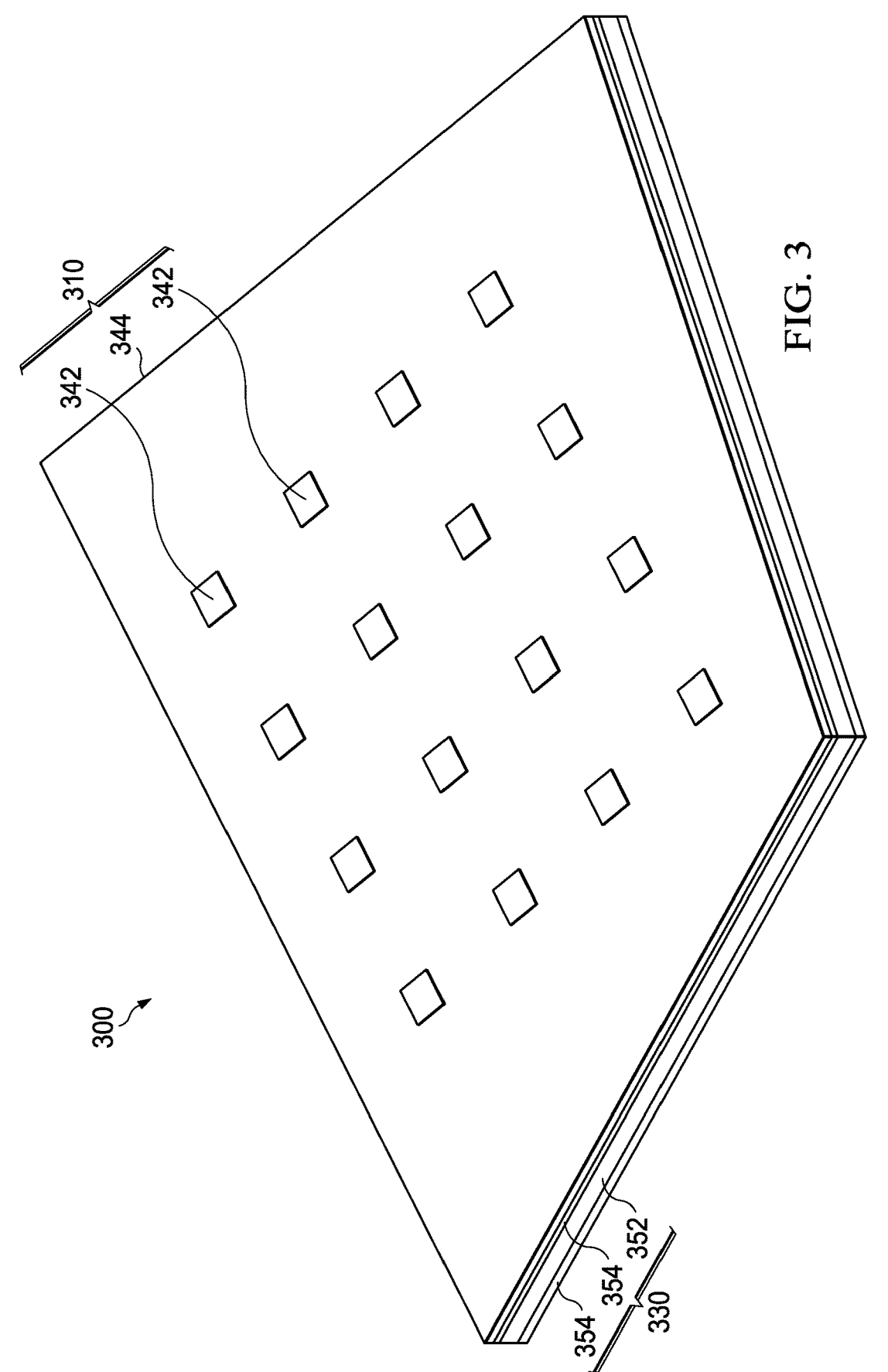
FIG. 3 is a diagram of a plasmonic metasurface with a BAW resonator, in accordance with various examples.
Figure 4:
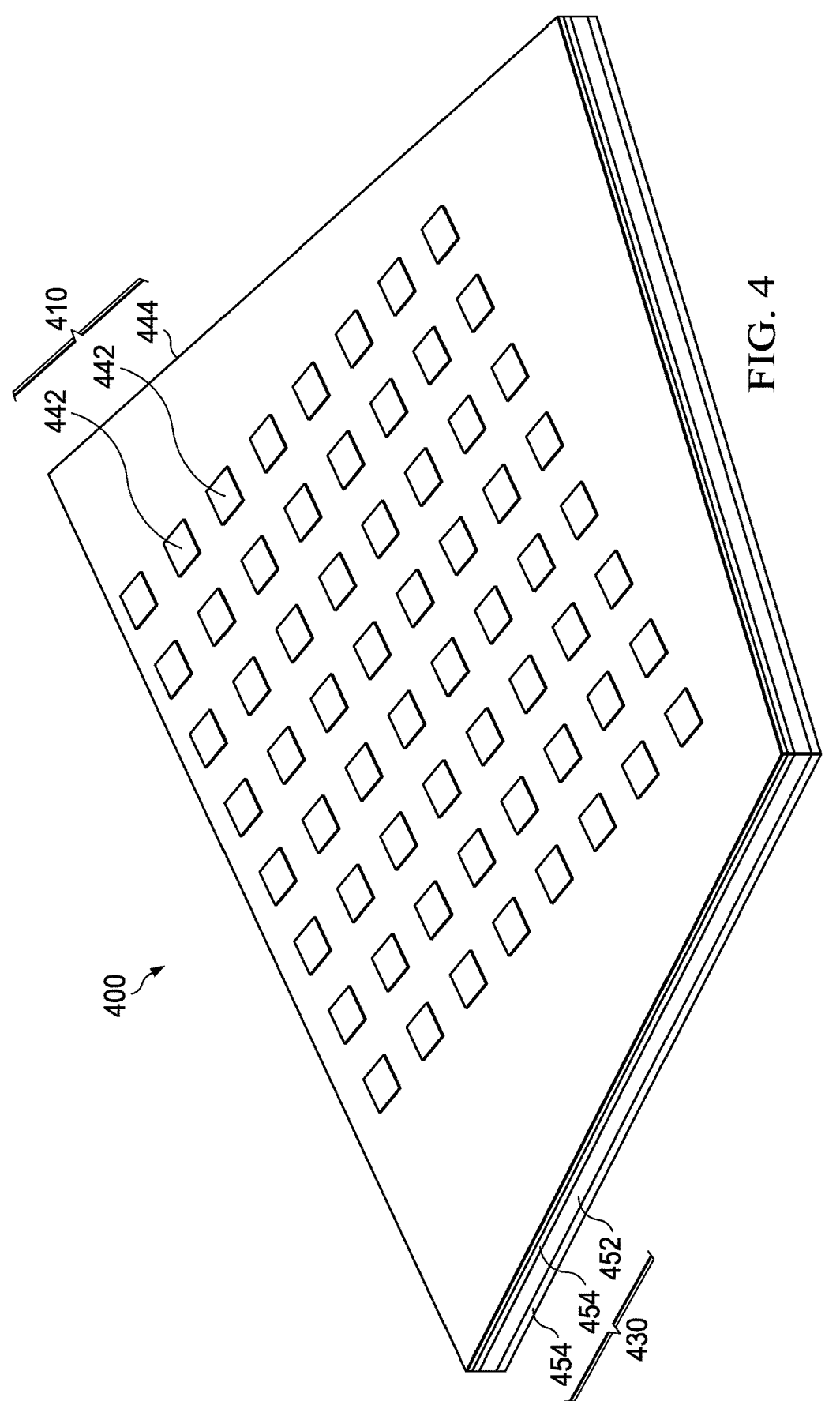
FIG. 4 is a diagram of a plasmonic metasurface with a BAW resonator, in accordance with various examples.

FIGS. 3 and 4 show designs 300 and 400, respectively, for optical devices including plasmonic metasurface and BAW resonator structures without an acoustic Bragg mirror, in accordance with various examples. The designs 300 and 400 include similar BAW resonators and plasmonic metasurfaces with differently sized metal patches. The design 300 of FIG. 3 includes a plasmonic metasurface 310 with a BAW resonator 330, in accordance with various examples. The plasmonic metasurface 310 includes multiple structures 342 arranged in a 2D array on an approximately 0.2 micrometer (μm) thick SiO2 layer as a dielectric layer 344. In various examples, the structures 342 are 2×2 μm² patches of Au that are equally spaced by approximately 4 μm in a 2D array formation. In this example, the plasmonic metasurface 310 includes 16 structures 342 in a 4×4 array. In other examples, the plasmonic metasurface 310 includes any suitable number of structures 342 in an array. The BAW resonator 330 includes an approximately 0.7 μm thick AlN layer as a piezoelectric layer 352 positioned between two approximately 0.3 μm thick Mo layers 354 as metal layers. The design 400 of FIG. 4 includes a plasmonic metasurface 410 with a BAW resonator 430, in accordance with various examples. The plasmonic metasurface 410 includes multiple structures 442 of 2×2 μm² Au patches equally spaced by approximately 8 μm and arranged in an 8×8 array on an approximately 0.2 μm thick SiO2 layer as a dielectric layer 444. The BAW resonator 430 includes an approximately 0.7 μm thick AlN layer as a piezoelectric layer 452 positioned between two approximately 0.3 μm thick Mo layers as metal layers 454. In some examples, the layers and structures of the designs 300 and 400 have approximately the same dimensions and materials. However, the structures 442 of the plasmonic metasurface 410 are spaced at half the distance of the structures 342 of the plasmonic metasurface 310, resulting in a denser 8×8 grid of square metal patches.

Figure 5:
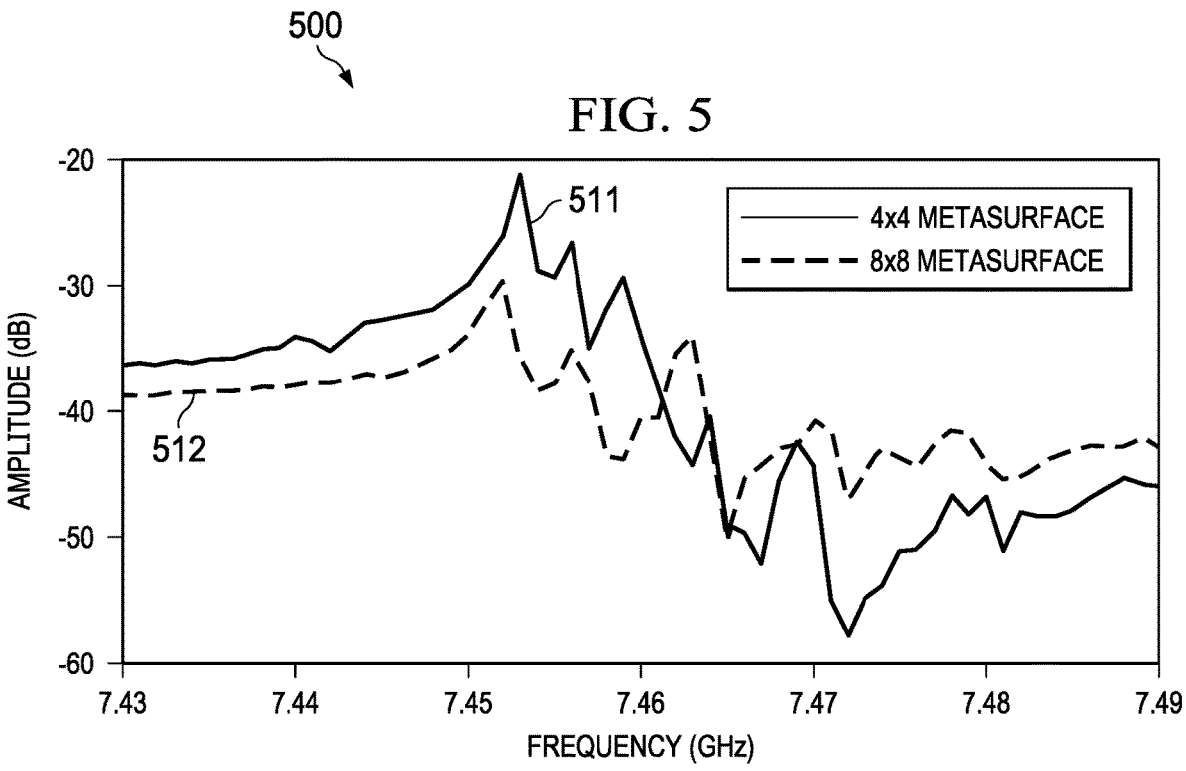
FIG. 5 is a graph showing admittance amplitude of acoustic waves on the plasmonic metasurfaces of FIG. 3 and FIG. 4, in accordance with various examples.
Figure 6:
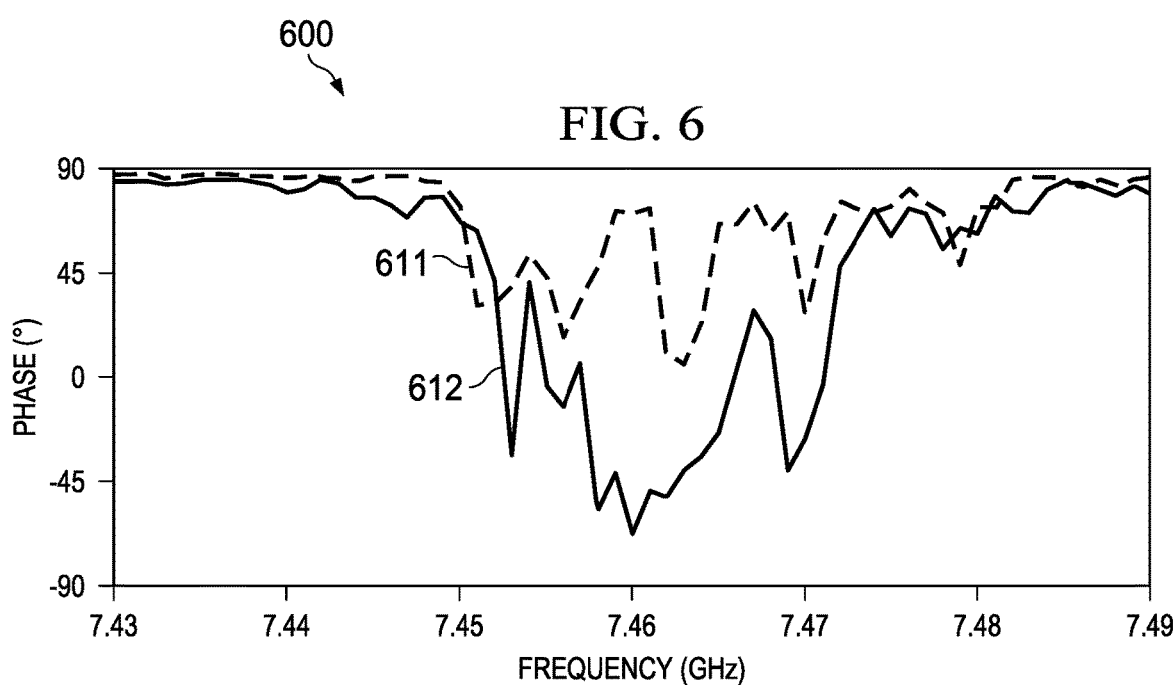
FIG. 6 is a graph showing admittance phase of acoustic waves on the plasmonic metasurfaces of FIG. 3 and FIG. 4, in accordance with various examples.

FIGS. 5 and 6 show admittance data for the designs 300 and 400 of FIGS. 3 and 4, respectively, in accordance with various examples. The admittance data may be separated into amplitude and phase data. FIG. 5 is a graph showing admittance amplitude data 500 of acoustic resonances generated in BAW resonators with different plasmonic metasurfaces 310 and 410 (e.g., the 4×4 array and 8×8 array plasmonic metasurfaces). The admittance amplitude data 500 include curves 511 and 512 for the designs 300 and 400, respectively. FIG. 5 represents the admittance amplitude data in decibel (dB) scale from about 7.4 to about 7.5 Gigahertz (GHz). FIG. 6 is a graph showing admittance phase data 600 of the same resonance responses generated in the BAW resonators with different plasmonic metasurfaces 310 and 410 as considered above at FIG. 5. The admittance phase data 600 include curves 611 and 612 for the designs 300 and 400, respectively. FIG. 6 represents the phase values in degrees of the acoustic resonance responses represented in FIG. 5, over the same frequency range as FIG. 5. In both the admittance amplitude data 500 and the admittance phase data 600, spurious modes in the form of fluctuations in the data values are visible over the frequency range in the form of multiple peaks and dips in the curves 511, 512, 611, and 612. The spurious modes are present in the data for both designs 300 and 400 irrespective of the number of structures 342, 442 included in the plasmonic metasurfaces 310, 410. The spurious modes may be attributed to the direct coupling between the plasmonic metasurface 310 and the BAW resonator 330 in the design 300, which may cause the acoustic wave in the BAW resonator 330 to interact with the structures 342 of the plasmonic metasurface 310. As described above, the acoustic coupling between the plasmonic metasurface 310 and the BAW resonator 330 may change and degrade the programmed acoustic resonance response of the BAW resonator 330. Similarly, the acoustic coupling between the plasmonic metasurface 410 and the BAW resonator 430 in the design 400 may change and degrade the programmed acoustic resonance response of the BAW resonator 430.

Figure 7:
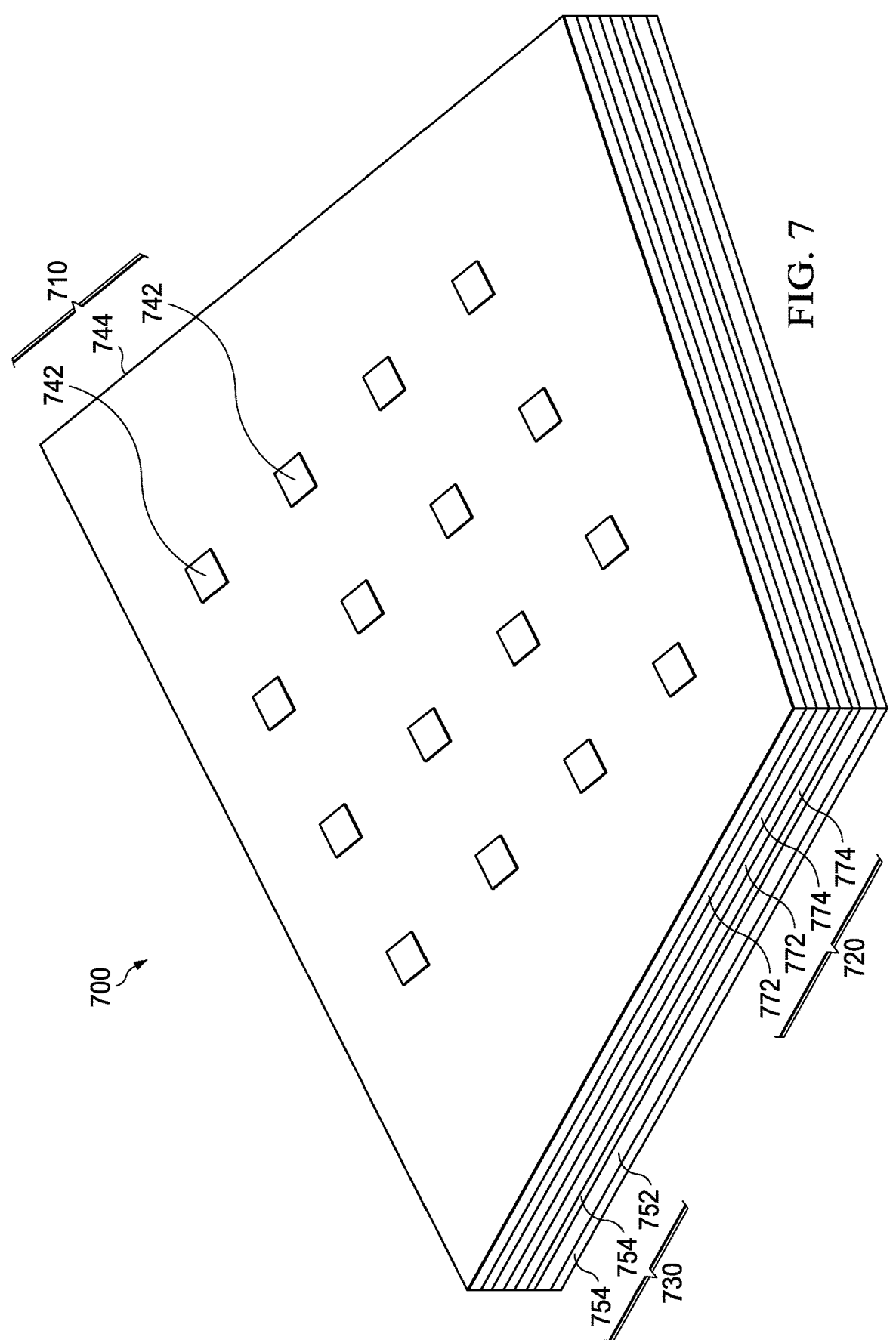
FIG. 7 is a diagram of a plasmonic metasurface with an acoustic Bragg mirror and a BAW resonator, in accordance with various examples.
Figure 8:
FIG. 8 is a diagram of a plasmonic metasurface with an acoustic Bragg mirror and a BAW resonator, in accordance with various examples.

FIGS. 7 and 8 show designs 700 and 800, respectively, for optical devices including an acoustic Bragg mirror between a plasmonic metasurface and a BAW resonator, in accordance with various examples. The designs 700 and 800 include similar BAW resonators and plasmonic metasurfaces with differently sized metal patches. The design 700 of FIG. 7 includes a plasmonic metasurface 710 with an acoustic Bragg mirror 720 and a BAW resonator 730, in accordance with various examples. The plasmonic metasurface 710 includes multiple structures 742 arranged in a 2D array on an approximately 0.2 μm thick SiO2 layer as a dielectric layer 744. In various examples, the structures 742 are 2×2 μm² Au patches equally spaced by approximately 4 μm in a 2D array formation. In this example, the plasmonic metasurface 710 includes 16 structures 742 in a 4×4 array. In other examples, the plasmonic metasurface 710 includes any suitable number of structures 742 in an array. The BAW resonator 730 includes an approximately 0.7 μm thick AlN layer as a piezoelectric layer 752 positioned between two approximately 0.3 μm thick Mo layers as metal layers 754. The acoustic Bragg mirror 720 is positioned between the plasmonic metasurface 710 and the BAW resonator 730 and includes two pairs of first and second acoustic impedance layers 772 and 774, each pair including an approximate 0.4 μm thick TiW layer and an approximately 0.5 μm thick SiO2 layer. The design 800 of FIG. 8 includes an acoustic Bragg mirror 820 between a plasmonic metasurface 810 and a BAW resonator 830, in accordance with various examples. The plasmonic metasurface 810 includes multiple of structures 842 of 2×2 μm² Au patches equally spaced by approximately 4 μm and arranged in an 8×8 array on a dielectric layer 844. The BAW resonator 830 includes an approximately 0.7 μm thick AlN layer as a piezoelectric layer 852 positioned between two approximately 0.3 μm thick Mo layers as metal layers 854. The acoustic Bragg mirror 820 is positioned between the plasmonic metasurface 810 and the BAW resonator 830 and includes two pairs of first and second acoustic impedance layers 872 and 874, each pair including an approximately 0.4 μm thick TiW layer and an approximately 0.5 μm thick SiO2 layer. In some examples, the layers and structures of the designs 700 and 800 have approximately the same dimensions and materials. However, the structures 802 of the plasmonic metasurface 810 are spaced at half the distance of the structures 842 of the plasmonic metasurface 810, resulting in a denser 8×8 grid of square metal patches.

Figure 9:
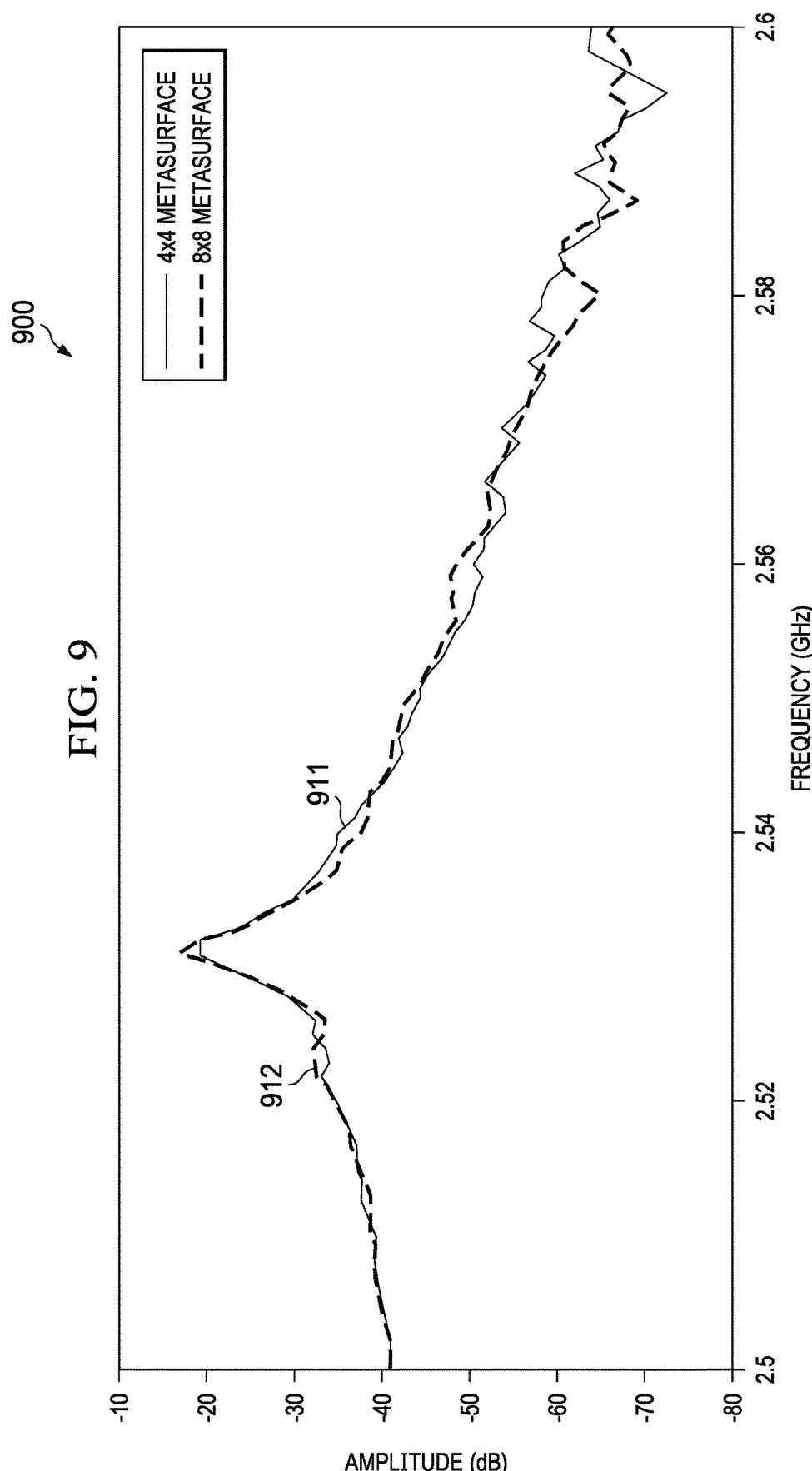
FIG. 9 is a graph showing admittance amplitude of acoustic waves on the plasmonic metasurfaces of FIG. 7 and FIG. 8, in accordance with various examples.
Figure 10:
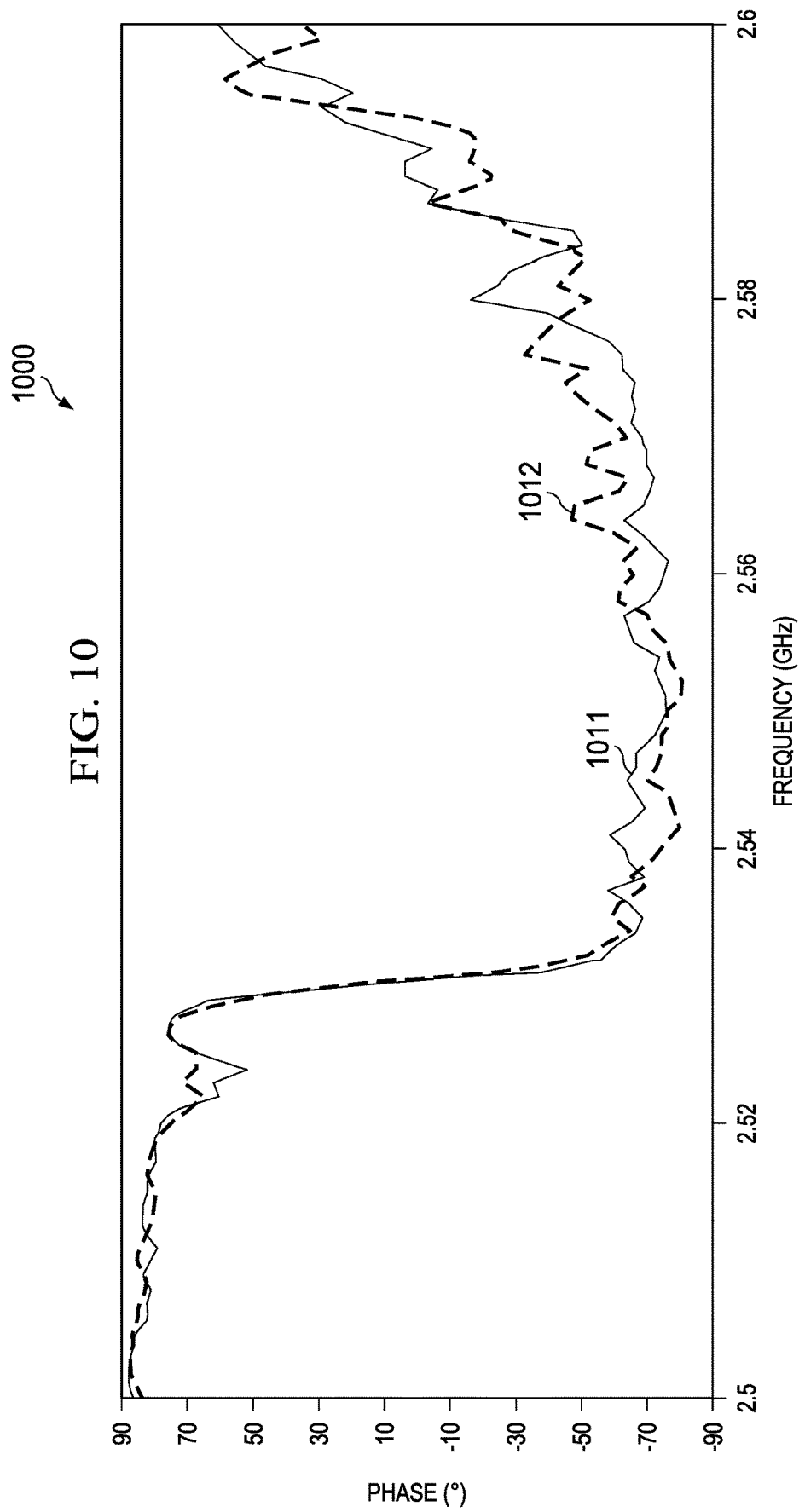
FIG. 10 is a graph showing admittance phase of acoustic waves on the plasmonic metasurfaces of FIG. 7 and FIG. 8, in accordance with various examples.

FIGS. 9 and 10 show admittance data for the designs 700 and 800 of FIGS. 7 and 8, respectively, in accordance with various examples. The admittance data may be separated into amplitude and phase data. FIG. 9 is a graph showing admittance amplitude data 900 of acoustic resonances generated in BAW resonators 730 and 830 with different plasmonic metasurfaces 710 and 810 (e.g., the 4×4 array and 8×8 array plasmonic metasurfaces). The admittance amplitude data 900 include curves 911 and 912 for the designs 700 and 800, respectively. FIG. 9 represents the admittance amplitude values in dB scale over a frequency range from about 2.5 to about 7.6 GHz. FIG. 10 is a graph showing admittance phase data 1000 of the same resonance responses generated in BAW resonators 730 and 830 with different plasmonic metasurfaces 710 and 810 as considered above at FIG. 9. The admittance phase data 1000 include curves 1011 and 1012 for the designs 700 and 800, respectively. FIG. 10 represents the phase values in degrees of the acoustic resonance responses represented in FIG. 9, over the same frequency range as FIG. 9. In the curves 911 and 912, the acoustic resonances, which correspond with the peak in the admittance amplitude, are shown at a frequency of about 2.53 GHz, irrespective of the number of structures 742, 842 included in the plasmonic metasurfaces 710 and 810 of the respective designs 700 and 800.

Similarly, the curves 1011 and 1012 include transitions in phase value at approximately the same frequency for both designs 700 and 800. In comparison to the admittance amplitude data 500 and admittance phase data 600 of FIGS. 5 and 6, respectively, the admittance amplitude data 900 and admittance phase data 1000 show fewer spurious modes in the curves 911, 912, 1011 and 1012. The increased resonance response and decreased energy fluctuations over the frequency range in the designs 700 and 800, leading to fewer spurious modes in the curves 1011 and 1012, may be attributed to including the acoustic Bragg mirror 720 or 820 between the plasmonic metasurface 710 or 810 and the BAW resonator 730 or 830. The acoustic Bragg mirror 720 or 820 provides acoustic isolation from the BAW resonator 730 or 830 to the plasmonic metasurface 710 or 810, as described above. As shown in FIGS. 9 and 10, this isolation mitigates the degradation of the designed acoustic resonance response of the BAW 730 or 830. The increased resonance response and decreased spurious modes are shown in the admittance amplitude data 900 and the admittance phase data 1000 for both designs 700 and 800, irrespective of the number of structures 742, 842 included in the plasmonic metasurfaces 710 and 810.

In some examples, reducing thermal coupling in an optical device improves optical detection, such as by reducing thermal coupling between a BAW resonator and an underlying substrate. For example, in the optical device 200 of FIGS. 2A to 2C, the length (l) to width (w) ratio of the contact 260 may be selected to make the contact 260 thinner, by increasing this ratio, to reduce thermal coupling between the BAW resonator 230 and the substrate 240. Increasing the ratio l/w may also increase the electrical resistance of the electrical signal collected from the BAW resonator 230 through metal electrode coupled to the BAW resonator 230 to the bonding pads located on the substrate 240. As a result, the Q factor of the admittance response of the BAW resonator, which depends on both acoustic and electrical losses, may decrease with the ratio l/w and degrade the resolution and noise equivalent power of the optical detector.

Figure 11:
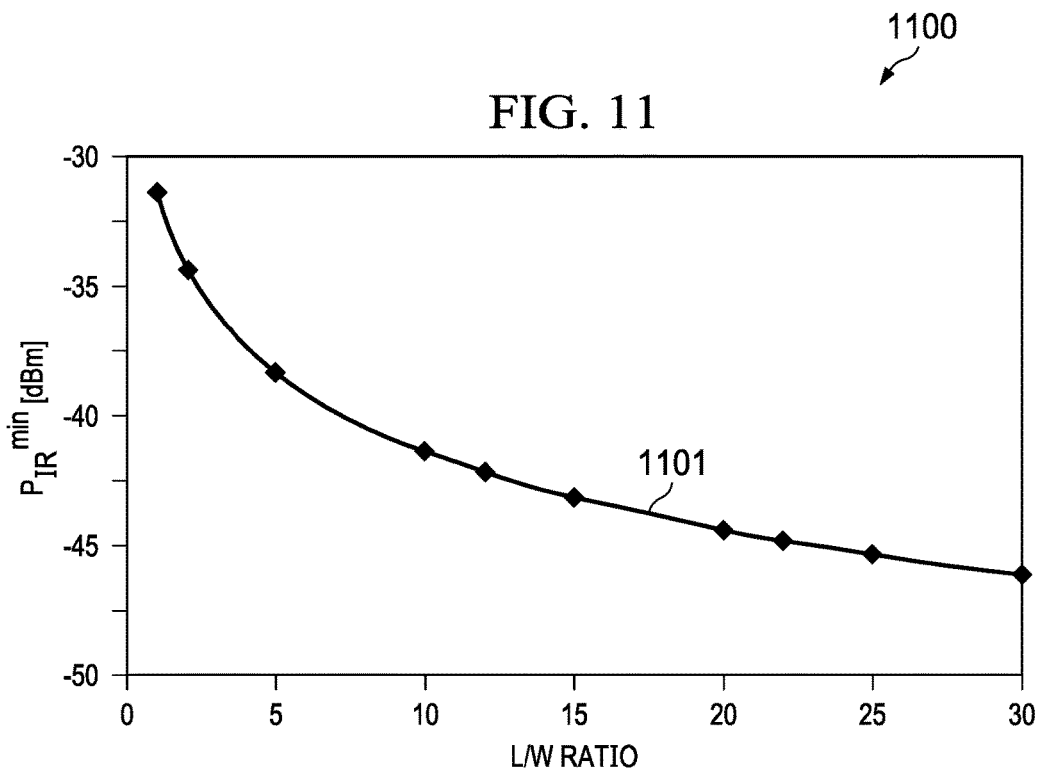
FIG. 11 is a graph showing detectable incident light power for a range of length to width ratios of contacts in an optical device, in accordance with various examples.

FIG. 11 is a graph showing detectable light power data 1100 for a range of length to width ratios of the two contacts 260 of the optical device 200, in accordance with various examples. In the example shown in FIG. 11, the piezoelectric layers 252 of the optical device 200 is an approximately 0.7 μm thick AlN layer positioned between two approximately 0.3 μm thick Mo layers as the metal layers 254. The detectable light power data 1100 is shown in a curve 1101 of dB milliwatts (dBm) values in a range of length to width (l/w) ratios. The curve 1101 represents the minimum amount of light power in the infrared (IR) spectrum that is detectable by the optical device 200. For FIG. 11, the l/w ratio is varied while other design parameters of the optical device 200 remain constant. The minimum amount of detectable IR light power ($P_{IR}^{min}$) may be calculated based on a minimum detectable temperature ($\Delta T^{min}$) which may be limited by the amount of noise in the optical device 200 or the BAW resonator 230. $P_{IR}^{min}$ decreases as the l/w ratio decreases. Examples of values of l and w may be in the range from ones to tens of μm. In this example, $\Delta T^{min}$ is approximately 8 millikelvin (mK), the surface area of the BAW resonator 230 is approximately 40000 μm2 and the IR light source power is approximately 700 Watts per square meter ($W/m^2$). The amount of incident light power may be higher than the minimum amount of detectable light power to provide enough energy for detection in the optical device 200.

Figure 12:
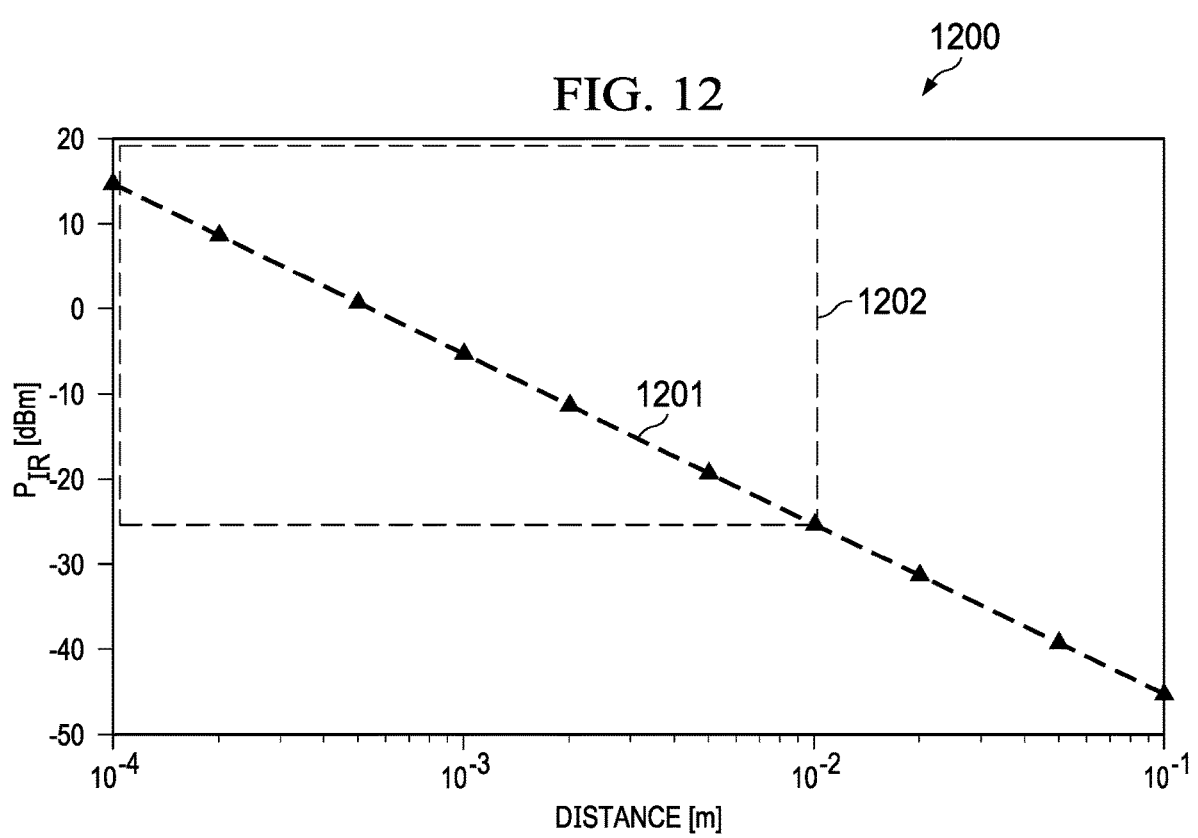
FIG. 12 is a graph showing incident light power for a range of distances from an optical device, in accordance with various examples.

FIG. 12 is a graph showing incident light power data 1200 for incident light on a surface of the optical device 200, in accordance with various examples. The incident light power data 1200 is shown for a range of distances between the light source and the optical device 200 for the same example as FIG. 11. The incident light power data 1200 is shown by a curve 1201 of dBm values for a range of distances between approximately $10^{-4}$ meters (m) and $10^{-1}$ m. The curve 1201 represents the amount of incident light power in the IR spectrum ($P_{IR}$). The portion 1202 of the curve 1201 shows a range of distances between approximately $10^{-4}$ m and approximately $10^{-2}$ m in which the amount of incident light power is sufficiently high for facilitating light detection in the optical device 200 given $P_{IR}^{min}$ of of about −30 dBm or lower. This $P_{IR}^{min}$ value may be achieved with a l/w ratio of approximately 1 or greater, as shown in FIG. 11.

Figure 13:
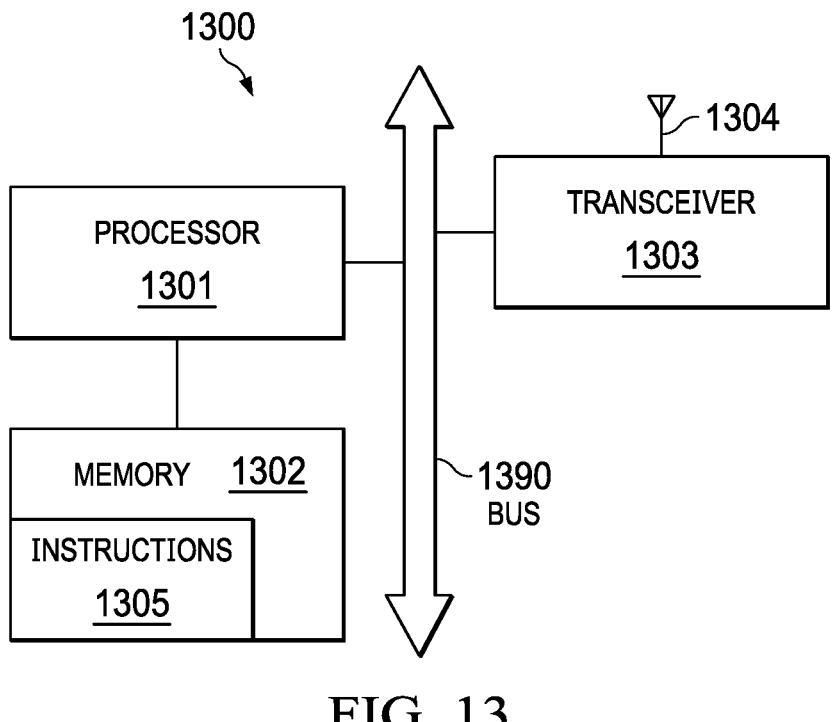
FIG. 13 is a block diagram of a hardware architecture for processing signal data, in accordance with various examples.

FIG. 13 is a block diagram of a hardware architecture 1300 of a processing system, in accordance with various examples. The hardware architecture 1300 includes hardware components that may be part of the processing system. For example, the hardware architecture 1300 may correspond to the processing system 140 in the light detector system 100. As shown in FIG. 13, the hardware architecture 1300 may include one or more processors 1301, and one or more memories 1302. In some examples, the hardware architecture 1300 may also include one or more transceivers 1303, and one or more antennas 1304 for establishing wireless connections. These components may be connected through a bus 1390 or in any other suitable manner. In FIG. 13, an example in which the components are connected through a bus 1390 is shown.

The processor 1301 may be configured to read and execute computer-readable instructions. For example, the processor 1301 may be configured to invoke and execute instructions stored in the memory 1302, including the instructions 1395. The processor 1301 may support one or more global systems for wireless communication. Responsive to the processor 1301 sending a message or data, the processor 1301 drives or controls the transceiver 1302 to perform the sending. The processor 1301 also drives or controls the transceiver 1303 to perform receiving, responsive to the processor 1301 receiving a message or data. Therefore, the processor 1301 may be considered as a control center for performing sending or receiving, and the transceiver 1303 is an executor for performing the sending and receiving operations.

In an example, the memory 1302 may be coupled to the processor 1301 through the bus 1390 or an input/output port. In another example, the memory 1302 may be integrated with the processor 1301. The memory 1302 is configured to store various software programs and/or multiple groups of instructions, including instructions 1395. For example, the memory 1302 may include a high-speed random-access memory, and may further include a nonvolatile memory such as one or more disk storage devices, a flash memory, or another nonvolatile solid-state storage device. The memory 1302 may store an operating system such as ANDROID, IOS, WINDOWS, or LINUX. The memory 1302 may further store a network communications program. The network communications program is useful for communication with one or more attached devices, one or more user equipment, or one or more network devices, for example. The memory 1302 may further store a user interface program. The user interface program may display content of an application through a graphical interface, and receive a control operation performed by a user on the application via an input control such as a menu, a dialog box, or a physical input device (not shown). The memory 1302 may be configured to store the instructions 1395 for implementing the various methods and processes provided in accordance with the various examples of this description.

The antenna 1304 may be configured to convert electromagnetic energy into an electromagnetic wave in free space, or convert an electromagnetic wave in free space into electromagnetic energy in a transmission line. The transceiver 1303 may be configured to transmit a signal that is provided by the processor 1301, or may be configured to receive a wireless communications signal received by the antenna 1304. In this example, the transceiver 1303 may be considered a wireless transceiver.

The hardware architecture 1300 may also include another communications component such as a Global Positioning System (GPS) module, a BLUETOOTH module, or a WI-FI module. The hardware architecture 1300 may also support another wireless communications signal such as a satellite signal or a short-wave signal. The hardware architecture 1300 may also be provided with a wired network interface or a local area network (LAN) interface to support wired communication.

In accordance with various examples, the hardware architecture 1300 may further include an input/output device (not shown), an audio input/output device, a key input device, a display, and the like. The input/output device may be configured to implement interaction between the hardware architecture 1300 and a user/an external environment, and may include the audio input/output device, the key input device, the display, and the like. The input/output device may further include a camera, a touchscreen, a sensor, and the like. The input/output device may communicate with the processor 1301 through a user interface.

The hardware architecture 1300 shown in FIG. 13 is a possible implementation in various examples of this description. During actual application or implementation, the hardware architecture 1300 may include more or fewer components. This is not limited herein.

The term "couple" appears throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C, if intervening component C does not substantially alter the functional relationship between device A and device B, such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through a construction and/or layout of hardware components and interconnections of the device, or a combination thereof.

A device that is described herein as including certain components may instead be adapted to be coupled to those components to form the described device. For example, a structure described as including one or more elements (such as structures or layers) and/or one or more sources (such as voltage and/or current sources) may instead include only the elements within a single physical device (e.g., the structures and layers in the device) and may be adapted to be coupled to at least some of the sources to form the described structure or system either at a time of manufacture or after a time of manufacture, such as by an end-user and/or a third-party.

While certain components may be described herein as being of a particular process technology, these components may be exchanged for components of other process technologies. Structures and designs described herein are reconfigurable to include the replaced components to provide functionality at least partially similar to functionality available prior to the component replacement.

Unless otherwise stated, "about," "approximately," or "substantially" preceding a value means +/−10 percent of the stated value. Modifications are possible in the described examples, and other examples are possible within the scope of the claims.

What is claimed is:

1. An apparatus, comprising:
   a substrate;
   a piezoelectric layer over the substrate;
   an acoustic reflector over the piezoelectric layer; and
   a first structure, a second structure, and a third structure over and on a same side of the piezoelectric layer, in which the piezoelectric layer and the acoustic reflector are between the first, second, and third structures and the substrate.

2. The apparatus of claim 1, further comprising a gap between the piezoelectric layer and the substrate.

3. The apparatus of claim 2, further comprising a metal layer between the gap and the piezoelectric layer.

4. The apparatus of claim 3, wherein the piezoelectric layer is partially exposed in the gap by the metal layer.

5. The apparatus of claim 1, further comprising first and second contacts on opposite sides of the piezoelectric layer.

6. The apparatus of claim 5, wherein each of the first contact and the second contact comprises a respective extension of the piezoelectric layer and a respective metal layer on the extension of the piezoelectric layer.

7. The apparatus of claim 5, wherein each of the first contact and the second contact has a length to width ratio configurable to cause detection of incident light power at or above a threshold.

8. The apparatus of claim 5, wherein the first contact and the second contact are configurable to provide thermal isolation of the piezoelectric layer.

9. The apparatus of claim 1, wherein the first, second, and third structures are part of an array of equally spaced metal patches.

10. The apparatus of claim 9, wherein a size and a spacing of the equally spaced metal patches are configurable to cause a peak in absorption of incident light at a particular frequency range.

11. The apparatus of claim 1, wherein the first, second, and third structures are part of a plurality of metallic structures spaced apart from each other.

12. The apparatus of claim 1, wherein the acoustic reflector includes a first layer and a second layer having different acoustic impedances.

13. The apparatus of claim 1, further comprising a first metal layer and a second metal layer, wherein the piezoelectric layer is between the first and second metal layers.

14. The apparatus of claim 1, wherein the piezoelectric layer is part of a bulk acoustic wave (BAW) resonator.

15. The apparatus of claim 1, wherein the acoustic reflector includes a Bragg mirror.

16. The apparatus of claim 1, wherein the first, second, and third structures are is part of a plasmonic metasurface.

17. The apparatus of claim 1, wherein the first, second, and third structures are part of a one-dimensional (1D) or a two-dimensional (2D) array of structures.

18. The apparatus of claim 1, wherein the acoustic reflector is between the first, second, and third structures and the piezoelectric layer.

19. The apparatus of claim 1, wherein a first distance between the first and second structures equals a second distance between the second and third structures.

20. An optical device, comprising:
    a substrate;
    a plasmonic metasurface;
    a bulk acoustic wave (BAW) resonator; and
    a Bragg mirror, in which the BAW resonator and the Bragg mirror is between the plasmonic metasurface and the substrate.

21. The optical device of claim 20, wherein the plasmonic metasurface is configurable to convert light of a frequency range to thermal energy, the BAW resonator is configurable to generate acoustic wave at a resonance frequency responsive to the thermal energy, and the Bragg mirror is configurable to confine at least a part of the acoustic wave at the BAW resonator.

22. The optical device of claim 21, wherein the Bragg mirror is configurable to reduce spurious modes in the acoustic wave with respect to components of the acoustic wave at the resonance frequency of the BAW resonator.

23. The optical device of claim 21, further comprising a processor configurable to detect electrically a shift in the resonance frequency responsive to the thermal energy.

24. The optical device of claim 20, wherein the Bragg mirror is between the plasmonic metasurface and the BAW resonator.

25. An apparatus, comprising:
    a light detector including:
        a piezoelectric layer;
        an acoustic reflector; and
        a plurality of structures over the acoustic reflector and the piezoelectric layer configurable to receive light.

26. The apparatus of claim 25, wherein the plurality of structures includes a plurality of metallic structures spaced apart from each other.

27. The apparatus of claim 25, wherein the plurality of structures includes a plurality of metal patches, and the piezoelectric layer is an Aluminum Nitrate (AlN) layer.

28. The apparatus of claim 25, wherein the light detector is configurable to detect a peak power of the light, and wherein the plurality of structures is configurable to absorb a portion of the light at a particular frequency range.

29. The apparatus of claim 25, further comprising a light emitter configurable to emit light, and the light detector is configurable to detect the light.

30. An apparatus comprising:
    a substrate;
    a piezoelectric layer over the substrate;
    an acoustic reflector; and
    a structure over the acoustic reflector, the structure configurable to absorb light of a particular frequency range, in which the acoustic reflector and the piezoelectric layer are between the structure and the substrate.

31. The apparatus of claim 30, wherein the structure is configurable to convert the light of the frequency range to thermal energy, and the piezoelectric layer is part of a resonator configurable to generate acoustic wave at a resonance frequency responsive to the thermal energy, and the acoustic reflector is configurable to confine at least a part of the acoustic wave at the resonator.

32. The apparatus of claim 30, wherein the acoustic reflector is between the structure and the piezoelectric layer.

* * * * *